United States Patent
Thompson et al.

(10) Patent No.: US 6,522,139 B1
(45) Date of Patent: Feb. 18, 2003

(54) CALIBRATION OF TIMING DELAYS USING ALTERNATING/REPEATING WAVEFORMS AND EPI

(75) Inventors: Michael R. Thompson, Cleveland Heights, OH (US); Wayne R. Dannels, Richmond Heights, OH (US)

(73) Assignee: Koninklijke Philips Electronics, N.V., Eondhoven (NL)

( * ) Notice: Subject to any disclaimer, the term of this patent is extended or adjusted under 35 U.S.C. 154(b) by 162 days.

(21) Appl. No.: 09/712,404

(22) Filed: Nov. 14, 2000

(51) Int. Cl.$^7$ .................................................. G01V 3/00

(52) U.S. Cl. ........................................ 324/307; 324/306

(58) Field of Search ................................. 324/300, 306, 324/307, 309, 312, 314, 318, 322

(56) References Cited

U.S. PATENT DOCUMENTS

| | | | |
|---|---|---|---|
| 5,349,296 A | | 9/1994 | Cikotte et al. ............... 324/309 |
| 5,493,224 A | * | 2/1996 | Shiono et al. ............... 324/307 |
| 5,810,727 A | * | 9/1998 | Groen ........................ 324/307 |
| 6,188,219 B1 | * | 2/2001 | Reeder et al. ............... 324/307 |

OTHER PUBLICATIONS

Reeder, et al. "A Novel Object–Independent "Balanced" Reference Scan For Echo–Planar Imaging", Journ. of Magnetic Resonance Imaging 9:847–852 (1999).

* cited by examiner

Primary Examiner—Louis Arana
(74) Attorney, Agent, or Firm—Fay, Sharpe, Fagan, Minnich & McKee, LLP (57) ABSTRACT

A magnetic resonance imaging system includes a gradient hardware subsystem (36), a radio frequency transmission hardware subsystem (30), and a data sampling and digitization hardware subsystem (40) A sequence control processor (20) applies control signals or pulses to the hardware subsystems to cause the implementation of a selected EPI imaging sequence. Due to inductive loads, analog filters, and other circuit constructions within the hardware subsystems, each of the hardware subsystems has a different inherent delay between receipt of a control signal and actually achieving the controlled function such as applying a gradient or RF pulse or sampling data. Due to these different inherent delays, the imaging sequence occurs with timing variations from the intended sequence. Echo planar imaging sequences are very sensitive to phase errors caused by these relative delays, which phase errors manifest themselves in the form of Nyquist ghosts. A calibration processor (60) analyzes resultant EPI images for Nyquist ghosts and adjusts a relative delay in the control signals from the signal processor until ghosting is minimized.

21 Claims, 5 Drawing Sheets

CALIBRATION OF TIMING DELAYS USING ALTERNATING/REPEATING WAVEFORMS AND EPI

BACKGROUND OF THE INVENTION

The present invention relates to the magnetic resonance arts. It finds particular application in conjunction with the calibration of magnetic resonance imaging systems and will be described with particular reference thereto. It is to be appreciated, however, that the invention will find other applications in the diagnostic imaging arts.

In magnetic resonance imaging, gradient and RF radio frequency pulses are applied to dipoles in an imaging region to excite and manipulate resonance. The excited resonance is sampled and digitized and demodulated to create data lines for reconstruction into an image representation. Typically, sequence control circuitry controls the timing with which the gradient and radio frequency pulses are applied, the resultant resonance is sampled, digitized, and demodulated. It is normally assumed that the hardware which applies the gradient and radio frequency pulses and the hardware which samples, digitizes, and receives the resultant resonance all perform their tasks immediately upon being instructed or enabled by the sequence control processor, or at least that all of the hardware responds with the same speed.

To the contrary, the various hardware subsystems discussed above do not react with the same speed.

Moreover, the analogous hardware subsystem on one machine does not necessarily react with the same speed as the corresponding hardware subsystem on a like machine. These non-constant delays cause various pulses to be applied and data to be sampled and demodulated at other than the prescribed time. These small temporal shifts cause phase errors in the resultant resonance signals and the reconstructed data lines.

Magnetic resonance images suffer from numerous artifacts caused by phase and other errors. The above-discussed timing errors are only one of many sources of phase errors. One common technique for dealing with phase errors is to display a magnitude image. That is, the image data are complex numbers. The phase errors adversely affect the imaginary portion of complex numbers. Working with only the real portion (also known as the modulus) of the complex value enables many phase error problems to be eliminated. Phase errors are further corrected using various processing techniques both during the image reconstruction process and in post-processing operations. These techniques fail to address the temporal errors which are the cause of some phase errors.

Scanners are calibrated using various calibration techniques. For example, once an ideal imaging sequence is devised, the sequence is often manually and iteratively tweaked to optimize it. Typically, an operator will adjust gradient or pulse heights and other sequence parameters to optimize the resultant image. Once the sequence is optimized, the same optimized sequence is used on every like model scanner.

The present application overcomes the above-referenced problems and others.

SUMMARY OF THE INVENTION

In accordance with one aspect of the present invention, there is provided a method of calibrating a magnetic resonance imaging scanner which generates imaging sequences that include gradient pulses, RF pulses, and data sampling windows. An echo planar imaging sequence which includes an RF pulse followed by an oscillating read gradient and data sampling windows under positive and negative lobes of the oscillating read gradient is applied. The sampled data is analyzed for ghosting artifacts. A relative timing between the oscillating read gradient and the data sampling windows is adjusted.

In accordance with another aspect of the present invention, a further calibration method is provided. An oscillating read gradient and a coincident data sampling window are provided. An oscillating waveform controlling RF demodulation of the received MR signal is provided. Sampled data is collected both with and without the demodulation waveform, and pairs of images are generated. Ghosting is analyzed and compared between the pairs of corresponding images. Timing of the receive demodulation waveform is adjusted, relative to the oscillating readout gradient. When the pairs of images exhibit identical ghosting characteristics, the waveforms are considered to be adjusted so as to minimize timing errors and phase errors associated with the demodulation.

In accordance with yet another aspect of the present invention, a method of calibrating a magnetic resonance imaging scanner is provided. An oscillating read gradient having opposite polarity lobes of like size is applied. An RF pulse sequence which includes alternating positive and negative RF pulses of like tip angle is applied. After an even number of gradient pulse lobes and an even number of RF pulses, a rephasing gradient of one half the lobe size is applied and residual magnetization is read out in the presence of a sampling gradient pulse. A relative temporal starting point of the oscillating gradient and the RF sequence is adjusted. These steps are repeated until the phase error is minimized. An RF/gradient pulse combination is repeated. After completion of the pulse train, image data is collected. If the RF pulse and the gradient are not coincident, shading will result in the subsequent image. The relative timing of the RF/gradient combination is adjusted until the shading is removed. Data may be collected in the spaces between the RF/gradient pulse combinations as well as to achieve a similar result.

In accordance with yet another aspect of the present invention, a magnetic resonance imaging system is provided. A gradient hardware subsystem generates magnetic field gradients in an imaging region. A radio frequency transmission hardware subsystem generates radio frequency pulses in the imaging region. A data sampling and digitization hardware subsystem samples magnetic resonance signals from the imaging region during sampling windows. Demodulation means are provided to be applied to the received signal. A sequence controller sends control signals to the gradient hardware subsystem, the radio frequency transmission hardware subsystem, demodulation subsystem, and the data sampling hardware subsystem to control the application of gradient and RF pulses and sampling windows of a selected imaging sequence. A delay means adjusts relative temporal application of the control signals to the gradient hardware subsystem, the radio frequency transmission hardware subsystem, the demodulation subsystem, and the data sampling and digitization subsystem.

One advantage of the present invention is that it reduces inherent causes of phase error.

Another advantage of the present invention resides in the ability to calibrate individual machines with nominally identical hardware systems as well as those with different hardware systems.

Another advantage of the present invention is that the calibrations of the present technique can be applied to all pulse sequences.

Another advantage of the present invention resides in reduced ghosting.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
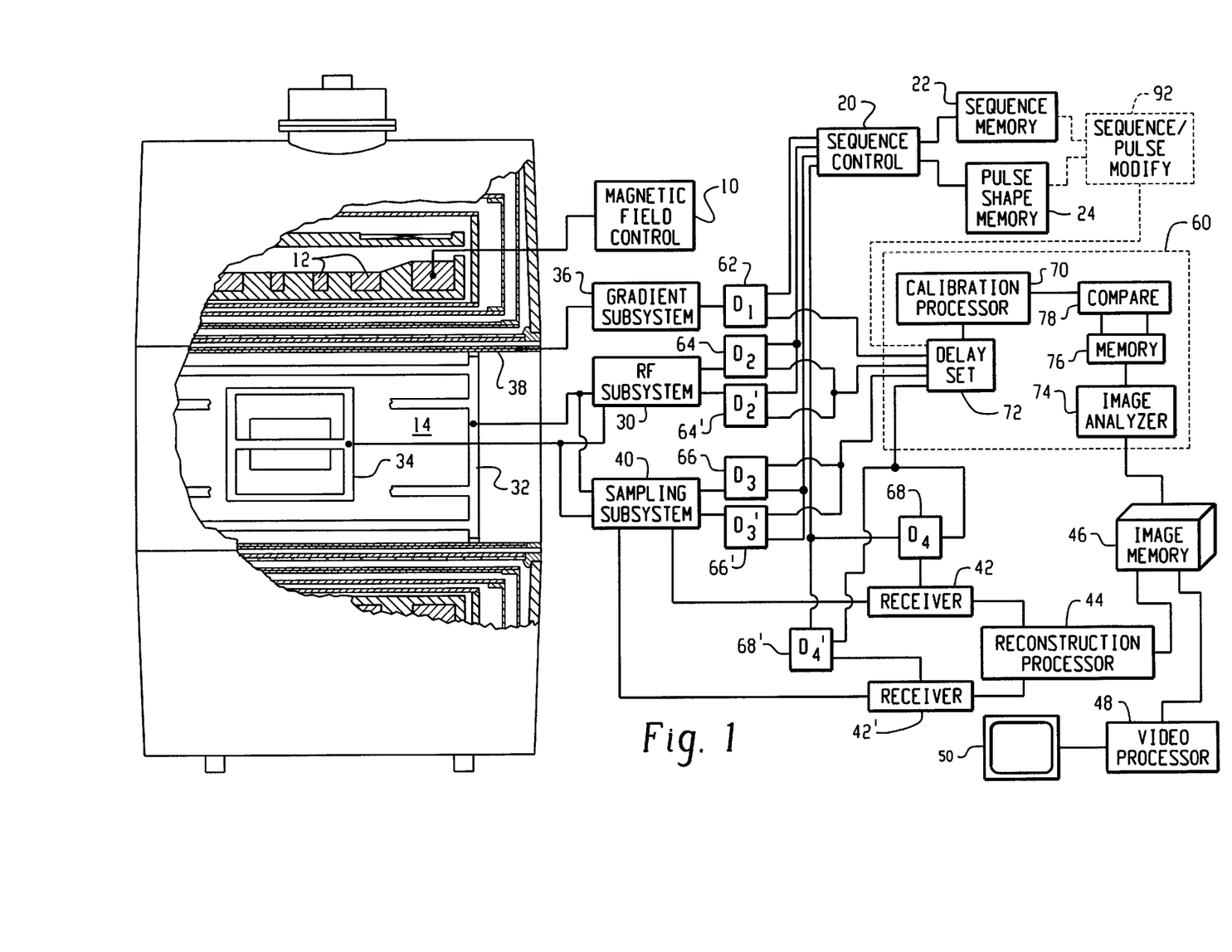
FIG. 1 is a diagrammatic illustration of a magnetic resonance imaging system in accordance with the present invention.

With reference to FIG. 1, an MRI scanner includes a main field control 10 that controls superconducting or resistive main field magnets 12. The magnets 12 generate a substantially uniform, temporally constant main magnetic field $B_0$ along a z or longitudinal axis through an examination region 14. In an imaging procedure, a magnetic resonance sequence is applied to a phantom, patient, or other subject being imaged. More specifically, a sequence control processor 20 accesses a sequence memory 22 which stores all of the magnetic resonance sequences which are available on the scanner. The sequences typically include a series of radio frequency and gradient magnetic field pulses. The pulse shapes or profiles are stored in a pulse shape memory 24. The sequence control processor 20 with the sequence timing and pulse information from the sequence memory and pulse shapes from the shape memory controls a series of hardware and software subsystems which actually apply the designated pulse sequence to the subject in the examination region. One example of a sequence control processor which controls and provides timing for gradient and RF profiles and waveshapes is shown in U.S. Pat. No. 5,349,296 of Dannels, Cikotte, and McBride.

Typically, the pulse sequences include one or more RF excitation or manipulation pulses which the sequence control processor 20 instructs a radio frequency transmitter subsystem 30 to apply to a whole-body radio frequency coil 32 or a localized or specialized RF coil 34. The sequence control processor 20 further controls a gradient pulse generating subsystem 36 which includes a plurality of gradient amplifiers and other associated hardware. The gradient pulse system applies current pulses to gradient coils 38 for generating gradient pulses of the prescribed shape across the examination region 14. Typically, the radio frequency and gradient pulses are applied with a preselected temporal relationship, such as concurrent or displaced by a preselected time interval. For example, to limit excitation to a selected slice, a slice select gradient is typically applied with the RF pulse applied dead center in the gradient pulse. Because the portion of the slice select gradient pulse which extends after the RF pulse causes dephasing, an opposite polarity gradient pulse is typically applied to rephase the magnetization. Because the RF pulse is to be applied in the center of the slice select gradient pulse, the rephasing pulse is typically of the opposite polarity, same amplitude, and half the duration. Of course, when the RF pulse is not positioned precisely centered in the slice select gradient pulse, then the area under the remaining portion of the slice select gradient does not match the area under the rephasing opposite polarity pulse, i.e., the dephasing and rephasing do not match. That is, a net phase error is introduced. In the past, the amplitude of the opposite polarity rephasing pulse was typically adjusted for optimization.

During the application of a selected sequence, there are typically one or more intervals in which data is to be sampled, commonly a time interval or window centered under a mid-point of a read gradient pulse. The sequence controller 20 enables a data sampling and digitizing subsystem 40 which samples resonance signals received on the whole body RF coil 32 or the localized RF coil 34 amplifies, filters, digitizes, and otherwise preliminarily processes them and conveys the processed signals to a digital receiver 42. The receiver demodulates the sampled signals to form digital data lines. In some embodiments, the whole body or localized coil include a plurality of coil elements which are connected to individual receivers. In some scanners, the receiver is controlled with the data sampling and digitizing circuit. In others, the sequence control processor generates specific enable signals for the receiver to demodulate the signals from the data sampling and digitizing subsystem.

Various system components cause different time delays between the time that the sequence controller sends the enable signal and the time the requested action is actually implemented. The gradient system applies large current pulses to large coils. Due to the large inductance of the gradient coils, there is a delay or lag between application of amplifier voltages and the associated changes in the magnetic field gradient. Analog filters, analog-to-digital conversion, digital processing steps, and other hardware and software actions again cause delays, but each different from the other.

The data lines from the receivers 42 are reconstructed by a reconstruction processor 44 into an image representation. The image representation is stored in an image memory 46. A video processor 48 reads out operator selected portions of the image representation and converts the read out data to appropriate format for display on an active matrix, CCD, video, or other monitor 50.

A calibration processor 60 analyzes the resultant image and other data and normalizes the delay in the various hardware subsystems. In the embodiment of FIG. 1, a delay circuit 62 is disposed between the sequence controller and the gradient hardware subsystem 36. Like delays can be provided for each gradient coil. Another delay circuit 64 is disposed between the sequence controller 20 and the RF transmission subsystem 30 for controlling delays on RF signals sent to the whole body RF coils. optionally, a similar delay circuit 64' is provided for control signals addressed to the localized RF coils. An additional delay circuit 66 is provided between the sequence controller and the data sampling and digitization subsystem 40. Optionally, the delay circuit 66 is used in conjunction with RF signals received by the whole body RF coil and a second delay circuit 66' is provided when the resonance signals are to be received by the localized coil. Analogously, one or more delay circuits 68, 68' are provided between the sequence control processor 20 and the digital receivers 42, 42'.

First, a calibration control processor 70 causes a delay setting circuit 72 to set the gradient coil delay timer 62 and the data sampling delay timer 66 to a nominal delay amount, e.g., 100 μsec. The nominal initial delay is selected to be as short as possible, but sufficiently long to avoid negative delays during the calibration process.

Figure 2:
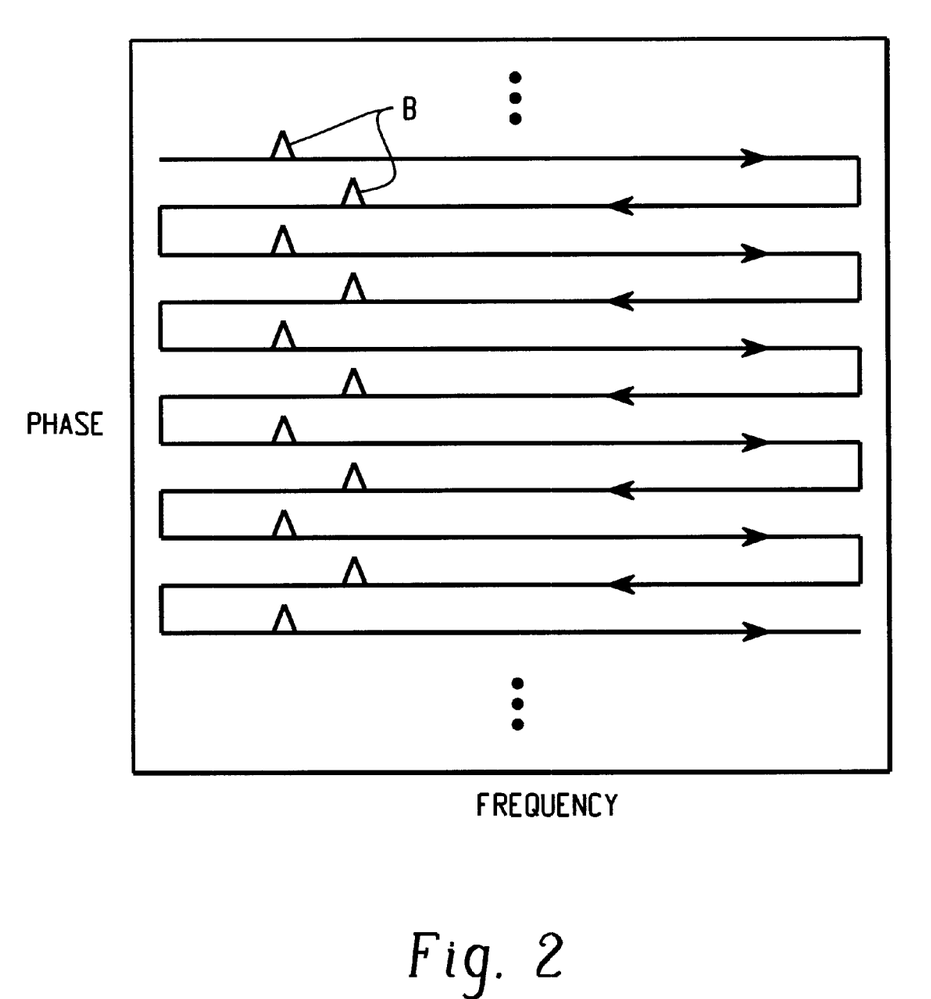
FIG. 2 is a k-space map illustrative of a cause of Nyquist ghosting.

With continuing reference to FIG. 1 and further reference to FIG. 2, the calibration controller 60 causes the sequence control processor 20 to select and implement an echo planar imaging (EPI) sequence in which alternate data lines traverse k-space in opposite directions. If the timing is off, there are phase errors denoted by echoes B in FIG. 2 where odd or right-going data lines are misaligned relative to the even or left-going lines. Alternating displacements in k-space such as illustrated in FIG. 2 cause Nyquist ghosting in the resultant image. The greater the misalignment, the stronger the ghosting. In the illustrated automated calibration embodiment, a phantom which has a strongly imaged element at the center of the examination region is imaged. When there is ghosting, a ghost of the center portion appears at the edges of the image. An image analysis circuit 74 analyzes the resultant image by comparing the intensity of the center of the image versus the intensity at the edges to determine the strength of the ghosting. The calibration control processor 70 iteratively adjusts the relative delay applied by the delay circuit 62 and the delay circuit 66. For example, the delay applied by the delay circuit 66 is shortened and lengthened. The process is iteratively repeated until ghosting artifacts are minimized, i.e., any displacement errors are reduced among the echoes B and the echoes are vertically aligned. More specifically, the image analyzing circuit 74 analyzes the relative intensity and stores the intensity and corresponding timing information in memory 76. A compare circuit 78 compares the relative intensity information. A conventional error minimization routine enables the control processor 70 to home in the optimum most efficiently.

With continuing reference to FIG. 1, demodulation of the received MRI signal is provided. In one preferred embodiment, demodulation waveforms pertaining to an RF frequency demodulation waveform are provided to demodulation components within the sampling subsystem 40. These waveforms are also controlled by the delay mechanisms 66 and 66', with said delays being distinct from the control of digitization itself.

Optionally, the optimization process is repeated for one or more localized gradient coils or data sampling rates. Once the relative delays are determined, the delay circuits 62, 66 are set. The calibration circuit 60 then commences adjustment and calibration of the delay circuit 64.

Figure 3:
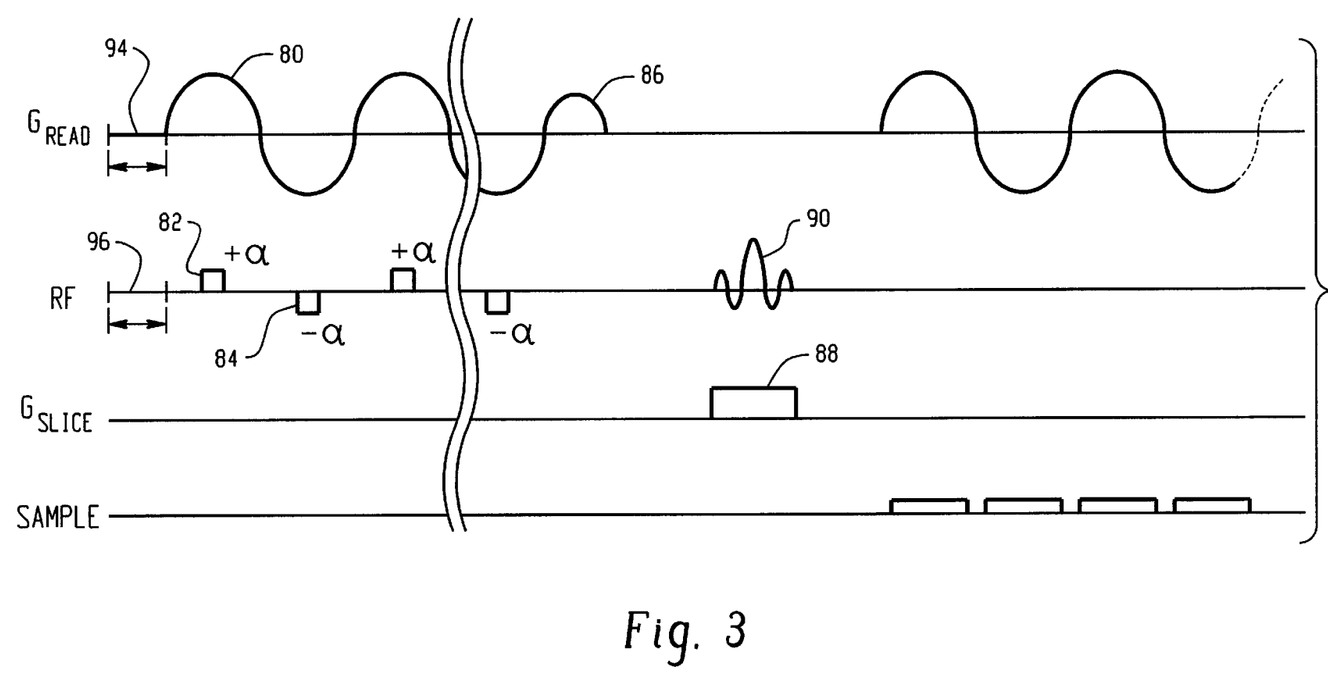
FIG. 3 is a diagrammatic illustration of a pulse sequence for aligning RF transmit amplitude and gradient waveforms.

With reference to FIG. 3 and continuing reference to FIG. 1, the calibration control processor 70 causes the sequence control processor 20 to select an RF calibration sequence from the sequence memory 22. In the calibration sequence, an oscillating read gradient 80 is applied. An RF pulse 82 of a preselected tip angle α, e.g., 1–5°, is applied nominally at the positive peak of the oscillating read gradient and an RF pulse 84 of minus the preselected tip angle, −α°, is applied nominally at the negative trough of the oscillating read gradient. After an even number of RF pulses have been applied, e.g., 20–100, a rephasing gradient 86 is applied which is one half the area of the prior read gradient lobes. Optionally, a shorter pulse train could be used with a larger, but less than 90°, tip angle. Thereafter, a slice select gradient 88 is applied with the RF signal 90 of an EPI sequence using the same read gradient. The resultant EPI image is monitored by the analysis circuit 74. The calibration process controller 70 adjusts the delay circuit 64, i.e., shifts the window of the RF transmit pulse, small distances back and forth until the misalignment of the transmit RF versus gradient waveforms is minimized.

Figure 4A:
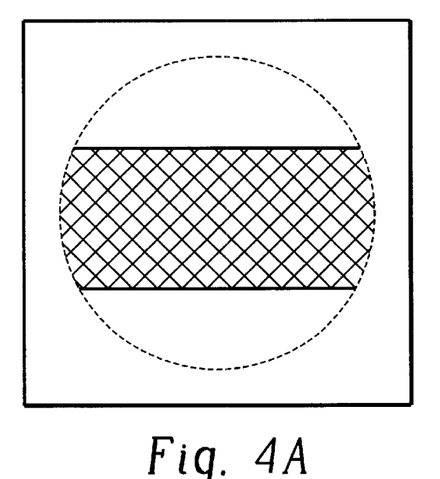
FIGS. 4A, 4B, 4C, and 4D illustrate calibration image displays indicative of progressively less temporal misalignment; and, FIGS. 5A and 5B are diagrammatic illustrations of a pulse sequence and a demodulation waveform to be added to the sequence.
Figure 4B:
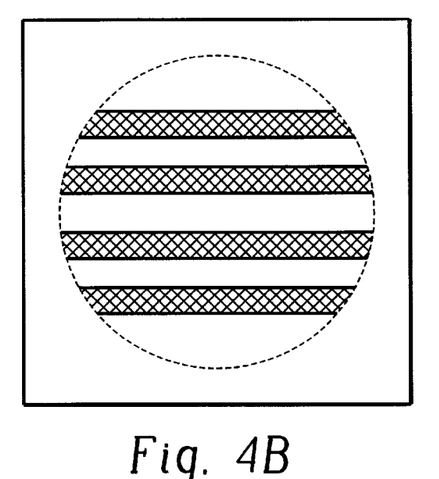
Figure 4C:
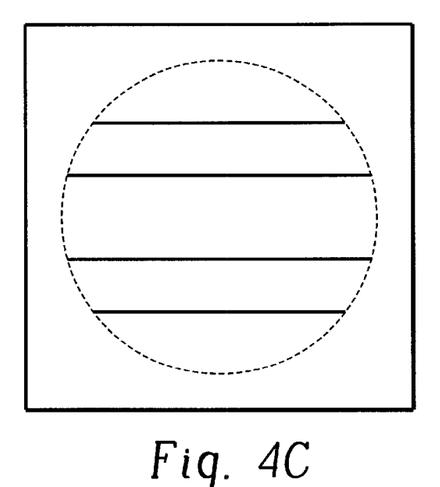
Figure 4D:
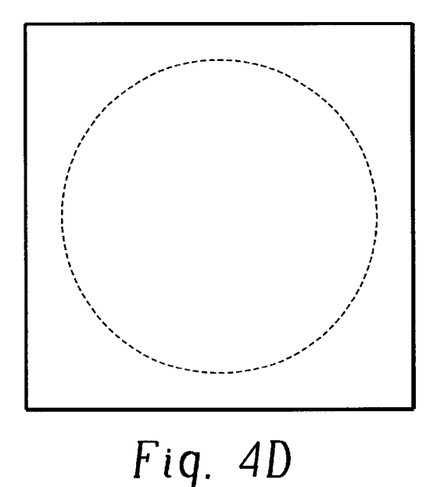

On the monitor, a temporal misalignment of greater than one half the width of the α RF pulse causes wide or touching dark bands (FIG. 4A). When the error is one half the RF pulse width, the display has distinct bands (FIG. 4B). As the delay is reduced, the dark bands narrow (FIG. 4C). At precise alignment, the dark bands disappear (FIG. 4D).

Figure 5A:
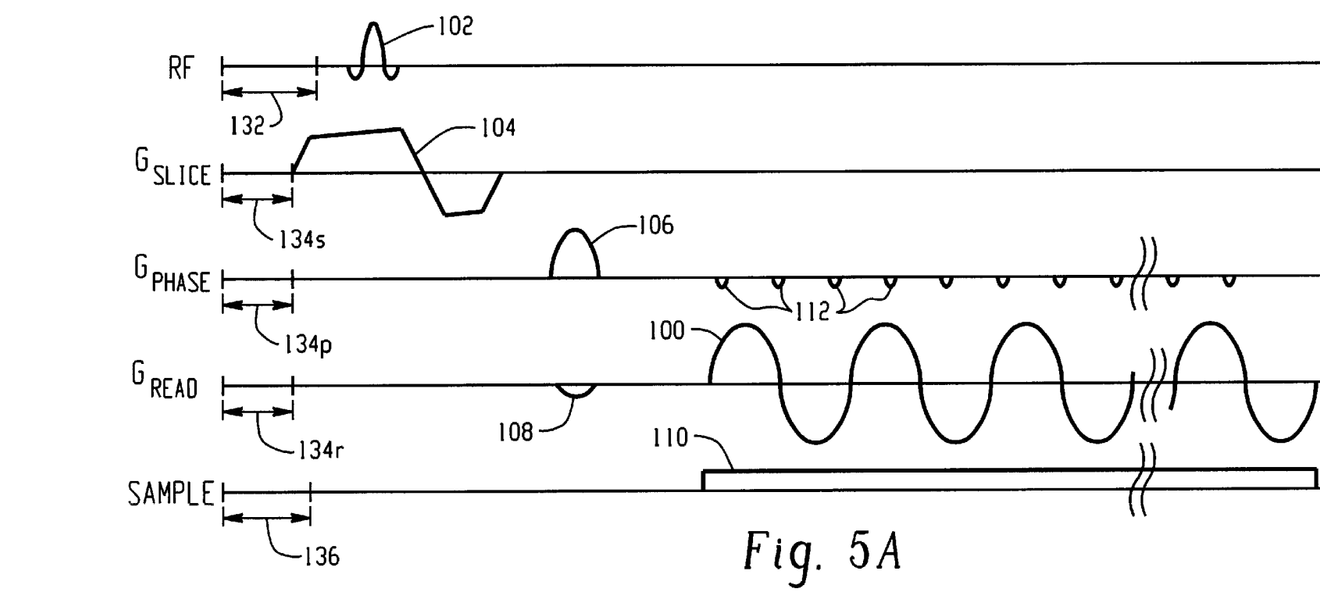
Figure 5B:
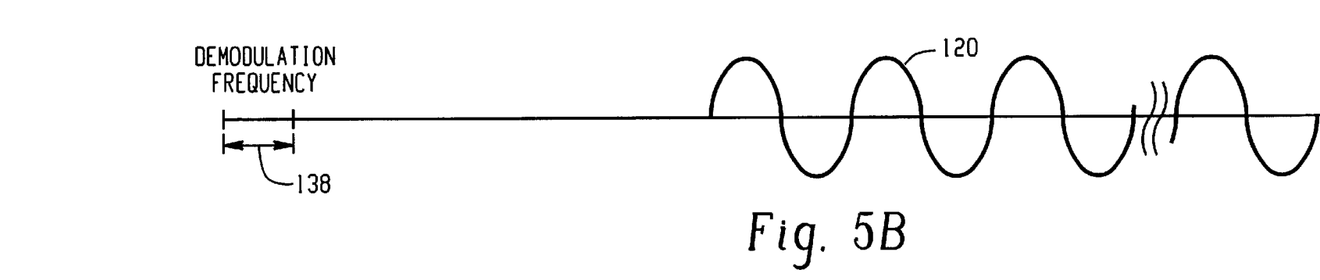

With reference to FIGS. 5A and 5B, the resonance frequency is proportional to the strength of the magnetic field. When an oscillating read gradient 100 is applied during an echo-planar imaging sequence, the resonance frequency of the resonating dipoles changes with the sum of the temporally constant primary magnetic field and the gradient magnetic field. The receivers 42 demodulate the resonance signals at the resonance frequency. Thus, the demodulation frequency in the receivers changes with a periodicity that matches the read gradient 100.

To calibrate the receiver or demodulation subsystem 42, an RF pulse 102 applied with a slice select gradient 104 excites resonance in a slice of a region of interest. An initial phase-encode gradient 106 and an initial read gradient 108 are applied. Thereafter, the oscillating read gradient 100 is applied with the previously calibrated temporal coordination with an enable or control pulse 110 to the sampling and digitization subsystem 40. Between each lobe of the oscillating read gradient, a phase-encode blip 112 is applied to step to the next data line in the phase-encode direction. The sequence control 20 also causes the demodulation frequency to vary with a periodicity or waveform 120.

After conducting an imaging sequence, an offset in the time at which the gradient frequency altering waveform 120 starts or is aligned relative to the read gradient 100 is shifted. The offset is shifted back and forth in subsequent repetitions until ghosting is minimized, which is indicative of accurate alignment of waveforms 100 and 120.

In an alternate embodiment, an installation or calibration technician monitors the resultant images and information and adjusts the delays without an automated calibration processor 60.

In another alternate embodiment, the delays are implemented in software. More specifically, a pulse shape sequence modification circuit 92 adjusts the beginning of the gradient, RF, data sampling, and other waveforms to add a zero amplitude flat 132, 134$_s$, 134$_p$, 134$_r$, 136, and 138 at the beginning or first pulse for each of the RF gradient, sampling and demodulation frequency pulse trains, respectively, of each imaging sequence. Adjusting the length of this zero amplitude flat adjusts a delay with which the first and hence, each subsequent pulse implemented by the same hardware subsystem is applied.

After the calibration is completed, its accuracy can be checked at any time by collecting two or three samples without any deghosting algorithm. An image collected at isocenter tests the data sampling correction. One or two images shifted along the read direction tests the frequency offset calibration. If any of these images exhibit significant ghosting, the calibration should be checked.

In another alternate embodiment, when delays between the various hardware components vary with respect to sampling rates and gradient waveform characteristics, a larger number of delay adjustments may be made to cover a variety of imaging conditions. For example, a table can be generated for each available sampling rate with its associated delays for decimation and filtering.

As another option, new sequences can be generated which accommodate the determined delay calibration values.

Instead of introducing delays in the sequences, a direct correction can be made for the phase errors associated with the delays. For example, a phase correction can be made to the sample data which offsets or subtracts the phase error attributable due to the delay.

As another alternative, calibration and delays can be implemented based on physical gradient hardware axes. That is, the gradients applied in the x, y, and z-directions and the RF subsystem sampling do not necessarily have the same delay.

It is appreciated that the means of RF receive demodulation in particular can be accomplished in conjunction with, or making use of, any of several other subsystems. In the description above, for sake of example, demodulation means were attributed to the receiver subsystem 42 and 42'. Alternately, demodulation may be implemented in part or in full with sampling subsystem 40, with RF subsystem 30, or with the reconstruction mechanism 44. Further, receive signal demodulation could be implemented with an independent hardware subsystem, not shown in FIG. 1, inserted before or after the receiver 42, 42', or sampling subsystems 40, 40'. Further, it is also appreciated that demodulation profiles may be provided in varied forms, such as frequency shift terms, phase angle terms, or combinations of both. Regardless of where the function of demodulation is accomplished, the relative timing can be adjusted by appropriate means relative to other described profiles and subsystems with this invention.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of calibrating a magnetic resonance imaging scanner which generates imaging sequences that include gradient pulses, RF pulses, and data sampling windows, the calibration method comprising:

(a) applying an echo-planar imaging sequence which includes applying an RF pulse followed by applying an oscillating read gradient and by data sampling windows concurrent positive and negative lobes of the oscillating read gradient;

(b) analyzing the sampled data for ghosting artifacts; and, (c) adjusting a relative timing between the RF pulse and the oscillating read gradient to reduce ghosting.

2. The method as set forth in claim 1 further including:

(d) repeating steps (a)–(c) until ghosting artifacts are minimized.

3. The method as set forth in claim 2 further including: reconstructing the EPI data into an image prior to the analyzing step (b).

4. The method as set forth in claim 2 wherein the adjusting step (c) includes:

altering waveforms applied during the echo-planar imaging sequence.

5. The method as set forth in claim 2 further including:

prior to step (a), setting a preselected nominal delay for both gradient pulse generation and data sampling windows.

6. The method as set forth in claim 2 further including:

(d) demodulating the sampled data with a demodulation frequency that is varied along an oscillating demodulation waveform with a common periodicity with the oscillating read gradient;

(e) reconstructing an image from the demodulated sampled data; and, (f) adjusting an offset between the oscillation read gradient and the demodulation waveform and repeating steps (a)–(e) until ghosting is minimized.

7. A method of calibrating a magnetic resonance imaging scanner which generates imaging sequences that include gradient pulses, RF pulses, and data sampling windows, the calibration method comprising:

(a) applying an echo-planar calibration sequence which includes an RF pulse followed by an oscillating read gradient and data sampling windows under positive and negative lobes of the oscillating read gradient;

(b) analyzing the sampled data for ghosting artifacts;

(c) adjusting a delay in control signals between a sequence controller and a gradient hardware subsystem and a data sampling hardware subsystem; and (d) repeating steps (a)–(c) until ghosting artifacts are minimized.

8. A method of calibrating a magnetic resonance imaging scanner which generates imaging sequences that include gradient pulses, RF pulses, and data sampling windows, the calibration method comprising:

(a) selecting pulse shape descriptions from a pulse shape memory;

(b) applying an echo-planar calibration sequence using the selected pulse shape descriptions which includes an RF pulse followed by an oscillating read gradient pulses and data sampling windows under positive and negative lobes of the oscillating read gradient pulses;

(c) analyzing the sampled data for ghosting artifacts;

(d) adding zero amplitude extensions to a beginning of the selected pulse shape descriptions of imaging sequences to alter relative timing; and, (e) repeating steps (b)–(d) until ghosting artifacts are minimized.

9. A method of calibrating a magnetic resonance imaging scanner which generates imaging sequences that include gradient pulses, RF pulses, and data sampling windows, the calibration method comprising:

(a) applying a calibration sequence which includes an RF pulse followed by gradient pulses and by data sampling windows under positive and negative lobes of a read gradient;

(b) analyzing the sampled data for ghosting artifacts;

(c) adjusting a relative time delay between gradient pulses and the data sampling windows to minimize ghosting; and, (d) after setting a ghosting minimizing relative delay between the gradient pulse and the data sampling windows, adjusting a relative delay between the radio frequency pulse application and the gradient pulse and the data sampling windows.

10. The method as set forth in claim 9 wherein setting the relative delay between the radio frequency pulses and the gradient pulse and data sampling windows includes:

applying an oscillating gradient having symmetric positive and negative lobes;

applying opposite polarity RF pulses of like tip angle near an apex of each positive and negative lobe;

after applying an even number of RF pulses, applying an echo-planar sequence reading out resonance data;

reconstructing an image from the resonance data;

adjusting a relative timing delay between the gradient pulse train and the RF pulse train until shading in the reconstruction image is minimized.

11. The method as set forth in claim 10, further including:

after the last gradient lobe, applying a rephasing lobe sized half as large as the gradient lobes.

12. A method of calibrating a magnetic resonance imaging scanner which generates imaging sequences that include gradient pulses, RF pulses, and data sampling windows, the calibration method comprising:

(a) applying an echo-planar imaging sequence which includes an RF pulse followed by an oscillating read gradient and data sampling windows under positive and negative lobes of the oscillating read gradient;

(b) analyzing the sampled data for ghosting artifacts;

(c) adjusting relative timing among at least two of (1) the RF pulses, (2) the oscillating read gradient, and (3) the data sampling windows; and, (d) after adjusting the timing, conducting imaging procedures using other than EPI sequences using the determined timing.

13. A method of calibrating a magnetic resonance imaging scanner which generates imaging sequences that include gradient pulses, RF pulses, and data sampling windows, the calibration method comprising:

(a) applying an oscillating read gradient having alternating opposite polarity lobes of like size;

(b) applying an RF pulse sequence which includes alternating positive and negative RF pulses of like tip angle;

(c) after an even number of gradient pulse lobes and an even number of RF pulses, applying a rephasing gradient of half the lobe size and reading out residual magnetization in the presence of a sampling gradient pulse;

(d) adjusting a relative temporal starting point of the oscillating gradient and the RF sequence;

(e) repeating steps (a)–(d) until phase error is minimized.

14. The method as set forth in claim 13 further including using the determined relative timing delay in a variety of subsequent imaging sequences.

15. The method as set forth in claim 13 wherein the step of reading out residual magnetization in the presence of a sampling gradient pulse includes application of an echo planar imaging sequence.

16. A method of calibrating a magnetic resonance imaging scanner which generates imaging sequences that include gradient pulses, RF pulses, and sampled resonance data demodulation, the method comprising:

(a) applying an echo-planar calibration sequence which includes an RF pulse followed by an oscillating read gradient and data sampling windows under positive and negative lobes of the oscillating read gradient;

(b) demodulating the sampled data with an oscillating demodulation waveform with a common periodicity with the oscillating read gradient;

(c) reconstructing the sampled data to generate an image;

(d) adjusting a temporal offset between the oscillating read gradient and the demodulation waveform; and, (e) repeating steps (a)–(d) until ghosting artifacts are minimized.

17. A magnetic resonance imaging system comprising:

a gradient hardware subsystem for generating magnetic field gradients in an imaging region;

a radio frequency transmission hardware subsystem for generating radio frequency pulses in the imaging region;

a data sampling hardware subsystem which samples magnetic resonance signals from the imaging region during sampling windows;

a receiver which demodulates the sampled magnetic resonance signals;

a sequence controller for sending control signals to the gradient hardware subsystem, the transmission hardware subsystem, the data sampling hardware subsystem and the receiver to control the application of gradient and RF pulses, the sampling windows and the resonance signal demodulation;

a delay means which adjusts relative temporal application of control signals to the gradient hardware subsystem, the transmission hardware subsystem, the data sampling hardware subsystem and the receiver.

18. The magnetic resonance imaging system as set forth in claim 17 further including:

a sequence memory for storing a plurality of imaging sequences;

a pulse shape memory for storing shapes of gradient pulses, RF pulses, and sampling windows that are applied in the stored imaging sequences; and, wherein the delay means includes a means for altering at least one of pulse shapes and sequence timing information stored in the sequence and pulse shape memories.

19. The magnetic resonance imaging system as set forth in claim 17 further including:

a calibration circuit which iteratively adjusts the delays until Nyquist ghosting is minimized.

20. A magnetic resonance imaging system comprising:

a gradient hardware subsystem for generating magnetic field gradients in an imaging region;

a radio frequency transmission hardware subsystem for generating radio frequency pulses in the imaging region;

a data sampling and digitization hardware subsystem which samples magnetic resonance signals from the imaging region during sampling windows;

a sequence controller for sending control signals to the gradient hardware subsystem, the transmission hardware subsystem, and the data sampling hardware subsystem to control the application of gradient and RF pulses and sampling windows of a selected imaging sequence; and, adjustable delay circuits disposed between the sequence control processor and the gradient hardware subsystem, the radio frequency transmission subsystem, and the data sampling and digitization hardware subsystem.

21. A magnetic resonance imaging system comprising:

a sequence memory for storing a plurality of imaging sequences;

a pulse shape memory for storing shapes of gradient pulses, RF pulses, and sampling windows that are applied in the stored imaging sequences;

a gradient hardware subsystem for generating magnetic field gradient pulses;

a radio frequency transmission hardware subsystem for generating radio frequency pulses;

a data sampling and demodulation hardware subsystem which samples and demodulates magnetic resonance signals from the imaging region during sampling windows;

a sequence controller for sending control signals to the gradient hardware subsystem, the transmission hardware subsystem, and the data sampling and demodulation hardware subsystem to control the application of gradient and RF pulses and sampling windows of a selected imaging sequence;

a means for altering at least one of pulse shapes and sequence timing information stored in the sequence and pulse shape memories;

an image analysis circuit for analyzing echo-planar images to determine a degree of ghosting;

an adjusting circuit for adjusting at least one of the gradient pulse shapes and the sequence timing information;

a comparing circuit which compares a degree of ghosting with differed relative delays and controls the altering means accordingly.

* * * * *